United States Patent
Smith et al.

(10) Patent No.: US 10,490,630 B2
(45) Date of Patent: Nov. 26, 2019

(54) METHOD OF PREVENTING BULK SILICON CHARGE TRANSFER FOR NANOWIRE AND NANOSLAB PROCESSING

(71) Applicant: Tokyo Electron Limited, Tokyo (JP)

(72) Inventors: Jeffrey Smith, Clifton Park, NY (US); Anton deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/812,313

(22) Filed: Nov. 14, 2017

(65) Prior Publication Data

US 2018/0138268 A1  May 17, 2018

Related U.S. Application Data

(60) Provisional application No. 62/421,522, filed on Nov. 14, 2016.

(51) Int. Cl.
*H01L 29/06* (2006.01)
*H01L 21/225* (2006.01)
(Continued)

(52) U.S. Cl.
CPC .......... *H01L 29/0673* (2013.01); *B82Y 10/00* (2013.01); *H01L 21/2252* (2013.01); *H01L 21/324* (2013.01); *H01L 21/76224* (2013.01); *H01L 21/76229* (2013.01); *H01L 21/823431* (2013.01); *H01L 21/823481* (2013.01); *H01L 27/088* (2013.01); *H01L 27/0886* (2013.01); *H01L 29/0649* (2013.01); *H01L 29/0847* (2013.01); *H01L 29/1029* (2013.01); *H01L 29/167* (2013.01); *H01L 29/42392* (2013.01); *H01L 29/66439* (2013.01); *H01L 29/66795* (2013.01); *H01L 29/775* (2013.01);
(Continued)

(58) Field of Classification Search
CPC ............. H01L 29/66795; H01L 29/785; H01L 29/7851; H01L 29/0665; H01L 29/0673
See application file for complete search history.

(56) References Cited

U.S. PATENT DOCUMENTS 8,753,942 B2  6/2014  Kuhn et al.
8,956,942 B2  2/2015  Loubet et al.
(Continued)

OTHER PUBLICATIONS

International Search Report and Written Opinion dated Feb. 21, 2018 in PCT/US2017/061550, 11 pages.

*Primary Examiner* — Kyoung Lee
*Assistant Examiner* — Christina A Sylvia
(74) *Attorney, Agent, or Firm* — Oblon, McClelland, Maier & Neustadt, L.L.P.

(57) ABSTRACT

A method of fabricating a semiconductor device includes providing a substrate having a layered fin structure thereon. The layered fin structure includes base fin portion, a sacrificial portion provided on the base fin portion and a channel portion provided on the sacrificial portion. A doping source film is provided on the substrate over the layered fin structure, and diffusing doping materials from the doping source film into a portion of the layered fin structure other than the channel portion to form a diffusion doped region in the layered fin structure. An isolation material is provided on the substrate over at least the diffusion doped region of the layered fin structure.

13 Claims, 16 Drawing Sheets

(51) Int. Cl.
*H01L 21/324* (2006.01)
*H01L 21/762* (2006.01)
*H01L 21/8234* (2006.01)
*H01L 27/088* (2006.01)
*H01L 29/08* (2006.01)
*H01L 29/10* (2006.01)
*H01L 29/167* (2006.01)
*H01L 29/423* (2006.01)
*H01L 29/66* (2006.01)
*H01L 29/78* (2006.01)
*B82Y 10/00* (2011.01)
*H01L 29/775* (2006.01)
*H01L 29/49* (2006.01)
*H01L 29/51* (2006.01)

(52) U.S. Cl.
CPC .... *H01L 29/785* (2013.01); *H01L 21/823412* (2013.01); *H01L 29/4966* (2013.01); *H01L 29/517* (2013.01); *H01L 29/66545* (2013.01); *H01L 29/66803* (2013.01)

(56) References Cited

U.S. PATENT DOCUMENTS

| | | |
|---|---|---|
| 9,012,284 B2 | 4/2015 | Glass et al. |
| 9,129,829 B2 | 9/2015 | Kuhn et al. |
| 9,224,810 B2 | 12/2015 | Kim et al. |
| 9,343,559 B2 | 5/2016 | Glass et al. |
| 9,520,393 B2 | 12/2016 | Loubet et al. |
| 9,583,491 B2 | 2/2017 | Kim et al. |
| 9,595,581 B2 | 3/2017 | Kuhn et al. |
| 9,728,621 B1* | 8/2017 | Cheng ................. H01L 29/4983 |
| 9,793,403 B2 | 10/2017 | Obradovic et al. |
| 9,812,524 B2 | 11/2017 | Glass et al. |
| 2008/0203491 A1* | 8/2008 | Anderson ......... H01L 29/66795 257/372 |
| 2010/0207208 A1* | 8/2010 | Bedell .................. B82Y 10/00 257/346 |
| 2012/0138886 A1 | 6/2012 | Kuhn et al. |
| 2013/0040447 A1* | 2/2013 | Swaminathan ....... C23C 16/045 438/558 |
| 2013/0161756 A1 | 6/2013 | Glass et al. |
| 2014/0175554 A1 | 6/2014 | Loubet et al. |
| 2014/0197377 A1 | 7/2014 | Kim et al. |
| 2014/0326952 A1 | 11/2014 | Kuhn et al. |
| 2015/0108585 A1 | 4/2015 | Loubet et al. |
| 2015/0228772 A1 | 8/2015 | Glass et al. |
| 2015/0303258 A1 | 10/2015 | Kuhn et al. |
| 2016/0086951 A1 | 3/2016 | Kim et al. |
| 2016/0260802 A1 | 9/2016 | Glass et al. |
| 2016/0308055 A1 | 10/2016 | Obradovic et al. |
| 2016/0329326 A1 | 11/2016 | Balakrishnan et al. |
| 2017/0053981 A1 | 2/2017 | Loubet et al. |
| 2017/0133277 A1 | 5/2017 | Kim et al. |
| 2017/0133462 A1 | 5/2017 | Kuhn et al. |
| 2017/0316980 A1* | 11/2017 | Chang ............ H01L 21/823418 |
| 2018/0138291 A1* | 5/2018 | Smith ............... H01L 29/66545 |

* cited by examiner

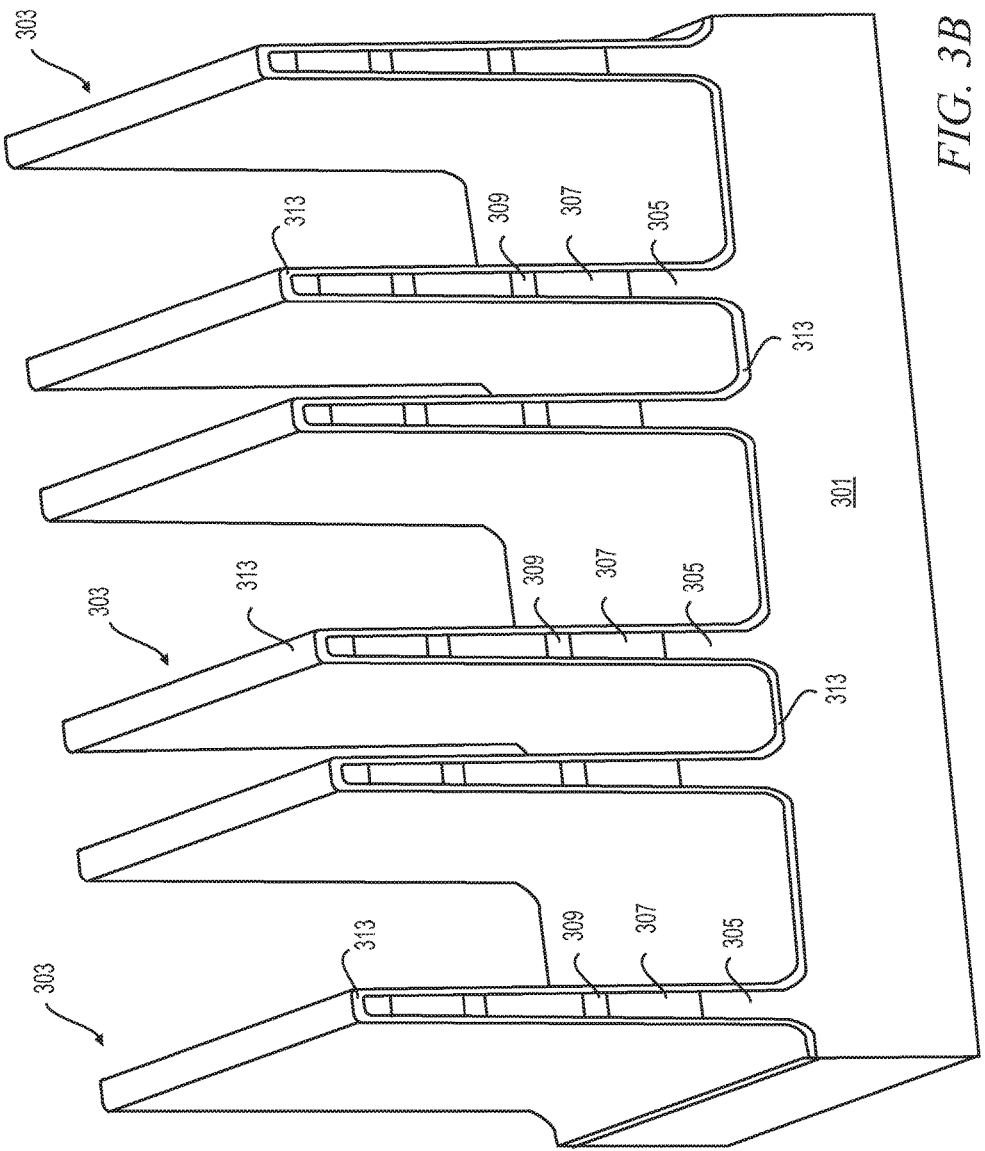

METHOD OF PREVENTING BULK SILICON CHARGE TRANSFER FOR NANOWIRE AND NANOSLAB PROCESSING

CROSS REFERENCE TO RELATED APPLICATIONS

This application is based on, and claims the benefit of priority to, U.S. provisional application No. 62/421,522 filed on Nov. 14, 2016, the entire contents of which are incorporated herein by reference.

BACKGROUND OF THE INVENTION

Field of the Disclosure

This disclosure relates to a method of manufacturing a semiconductor device such as an integrated circuit and transistors and transistor components for an integrated circuit.

Discussion of Background Art

Manufacturing of a semiconductor device (especially on the microscopic scale) involves various fabrication processes such as film-forming depositions, etch mask creation, patterning, material etching and removal, as well as doping treatments, that are performed repeatedly to form desired semiconductor device elements on a substrate. Historically, with microfabrication, transistors have been created in one plane, with wiring/metallization formed above such plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other.

There remains a continuing need to provide scaling of improved and high performing semiconductor devices, as well as a need for corresponding manufacturing processes.

SUMMARY

One object of the present disclosure is to provide 3D semiconductor devices and methods which improve electrical performance and reliability. These and other objects are provided by embodiments disclosed herein including the following numbered example aspects of the invention.

(1) A method of fabricating a semiconductor device includes providing a substrate having a layered fin structure thereon, the layered fin structure including a base fin portion, a sacrificial portion provided on the base fin portion and a channel portion provided on the sacrificial portion. A doping source film is provided on the substrate over the layered fin structure, and diffusing doping materials from the doping source film into a portion of the layered fin structure other than the channel portion to form a diffusion doped region in the layered fin structure. An isolation material is provided on the substrate over at least the diffusion doped region of the layered fin structure.

(2) The method of aspect (1), wherein the providing a substrate includes providing the base fin as a bulk fin formed from a bulk of doped Si. A multilayer fin structure is provided on the bulk fin, wherein the multilayer fin structure includes providing the sacrificial portion as a plurality of SiGe layers alternating with a plurality of Si layers which form the channel portion (3) The method of aspect (2), wherein each of the plurality of Si layers form a nanowire or nanoslab.

(4) The method of aspect (2), wherein the providing a doping source film includes providing the doping source film over only a portion of the layered fin structure, a position of the doping source film being selected to prevent diffusion of the doping material into the channel portion.

(5) The method of aspect 4, wherein the position of the doping source film is selected to cover at least part of the base fin portion of the layered fin structure.

(6) The method of aspect 5, wherein the position of the doping source film is selected to cover the base fin portion of the layered fin structure.

(7) The method of aspect 6, wherein the position of the doping source film is selected to cover a portion of the sacrificial portion of the layered fin structure.

(8) The method of aspect 1, wherein the diffusing includes a performing a drive anneal heating to diffuse the doping materials into the layered fin structure.

(9) The method of aspect 8, wherein the diffusing further includes performing source/drain spike anneal heating to diffuse the doping materials into the layered fin structure.

(10). The method of aspect 8, wherein the diffusing further includes tuning at least one of a time and temperature of the drive anneal to prevent diffusing the doping materials into the channel portion of the layered fin structure.

(11). The method of aspect 1, wherein the providing an isolation material including forming a shallow trench isolation layer on the substrate to cover at least the diffusion doped region of the layered fin structure.

(12) The method of aspect 1, further including providing a screen layer over the layered fin structure, the doping source layer being provided on the screen layer.

(13) The method of aspect 1, further including providing a liner over the doping source layer before the diffusing.

(14) Another aspect includes a semiconductor device, including a substrate, and a fin structure provided on the substrate. The fin structure including a base fin portion of semiconductor material, the base fin portion including a diffusion doped region, and a channel portion of semiconductor material provided on the base fin portion and vertically spaced from the base fin portion. A gate structure is arranged between the base fin portion and the channel portion and including a conducting material, wherein diffusion doped region is configured to electrically isolate the base fin portion from the gate structure. An isolation structure is formed on the substrate and covering at least the diffusion doped region.

(15) The semiconductor device of aspect 14, wherein the fin structure includes a bulk fin provided as the base fin portion and formed from a bulk of doped semiconductor material; and a plurality of vertically stacked semiconductor layers provided as the channel portion. The plurality of vertically stacked semiconductor layers are spaced from each other and doped as a same polarity type as the doped semiconductor material. The diffusion doped region has an opposite polarity type than the doped semiconductor material to provide counter-doping of the bulk fin.

(16). The semiconductor device of aspect 15, wherein each of the plurality of Si layers form a nanowire or nanoslab.

(17) The semiconductor device of aspect 15, wherein the bulk of doped semiconductor material comprises p-type doping material.

(18) The semiconductor device of aspect 16, wherein the plurality of vertically stacked semiconductor layers each comprise p-type doping material.

(19) The semiconductor device of aspect 15, wherein the diffusion doped region comprises n-type doping material.

(20) The semiconductor device of aspect 19, wherein the n-type doping material comprises phosphorous or arsenic.

BRIEF DESCRIPTION OF THE DRAWINGS

The accompanying drawings, which are incorporated in and constitute a part of the specification, illustrate one or more embodiments and, together with the description, explain these embodiments. The accompanying drawings have not necessarily been drawn to scale. Any values dimensions illustrated in the accompanying figures are for illustration purposes only and may or may not represent actual or preferred values or dimensions. Where applicable, some or all features may not be illustrated to assist in the description of underlying features. In the drawings:

FIG. 3B is a perspective cross-section view of an example intermediate structure in a process of manufacturing the device of FIG. 2 according to certain aspects of the present disclosure;

DETAILED DESCRIPTION

Techniques herein pertain to device fabrication using gate-all-around processing incorporating nanowires (or nanoslabs or nanosheets) in a nanowire FET (field effect transistor) or through a stacked complimentary FET device. Gate-all-around (GAA) identifies a FET device in which a metal gate is physically wrapped around a silicon or silicon/germanium wire and is a further extension of the tri-gate process where the gate is wrapped around a silicon or silicon/germanium fin. With fin FETs, the gate wraps around on three of four sides, while with GAA FET devices, the gate wraps around all a given channel (whether the given channel has a rectangular or circular cross-section). One type of a GAA FET device is a nanowire FET.

Figure 4:
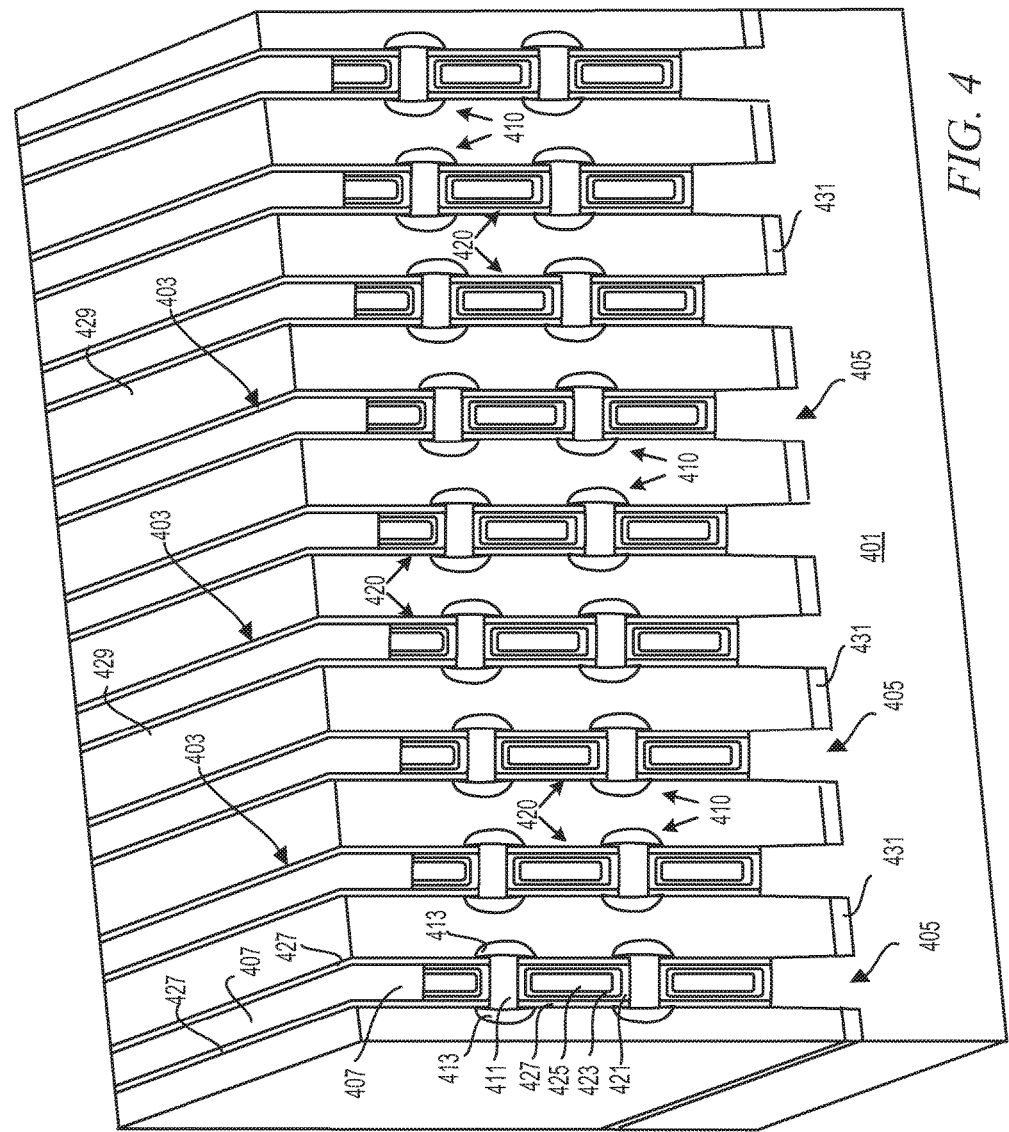
FIG. 4 is a perspective cross-section view of a semiconductor device in which a gate charge may be transferred to an adjacent gate structure.

FIG. 4 shows a perspective view of a GAA nanowire structure from the orientation along the nanowire itself. As seen, the device includes a substrate 401 having an array of stacked nanowire structures 403 provided thereon. Each stacked structure 403 includes a bulk fin portion 405 having nanowire devices 410 and gate structures 420 provided thereon. The bulk fin 405 is a portion of an intermediate fin structure that is processed to form the nanowire devices 410 and gate structures 420. Each nanowire device 410 includes a nanowire channel region 411 having source/drain regions 413 on opposing sides thereof. Each gate structure 420 is a multilayer structure surrounding the nanowire channel region 411, which includes a high-k layer 421, a work function metal layer 423 and a gate metal fill 425. Cap 407 is provided over each fin 403, and gate spacers 427 electrically insulate the gate structures 420 from source/drain metal 429 provided between adjacent stacked nanowire structures 403. Shallow trench isolation structure 431 is provided between fin structures 403.

In a GAA device, the gate metal 425 is charged through a gate contact (not shown) and the charge is carried through work-function metal 423 before passing through the nanowire, nanosheet or nanoslab 411. The charge to the individual gate is desired to be contained to within that selected gate and not within the adjacent source/drain bar 429 by incorporation of a dielectric gate spacer 427. For a nanowire or nanoslab design, however, where the wires are formed through an intermediate process from a multi-layered fin composed of silicon and silicon germanium (for example), there will be a residual of the fin at the bottom or base of the metal gate structure. The silicon from this fin 405 will similarly have deposition of high-k film 421 such as HfO and work-function metal 423 such as TiN deposited overtop of it. The result of this could potentially be in the buried fin becoming charged during the charging of a specific gate and having this charge carried by the residual fin structure to adjacent gate structures, thus leading to electrical performance issues and/or device failure. From FIG. 4 it can be seen that any charge to a specific gate can be transferred to the bulk silicon fin through the work function metal 423 and then carried over to an adjacent gate.

According to discoveries herein, the bulk silicon fin placed under the metal gate is isolated from the metal gate structure. One technique to accomplish this includes counter-doping the bulk silicon to neutralize the fin and prevent it from being charged during the charging of a specific metal gate. The counter doping cannot impact the actual nanowire or nanosheets which will be placed directly above the bulk silicon fin so the doping process benefits from a solid source doping method as opposed to a conventional implant process. Another technique includes a method in which the bulk silicon fin is further recessed sufficiently under the metal gate and additional layers of dielectric deposited over the bulk silicon fin. The recessing technique can be more difficult from a process integration method because the dielectric material needs to be deposited directly into the opened replacement gate once the silicon wire release process has been completed. Also, material would need to be isotoprically recessed within the opened replacement gate to fill in the bottom of the gate while ensuring that the wires have no residual of the dielectric deposition, and that the bottom of the gate is deposited with thickness adequate to prevent charge transfer to the bulk silicon fin. Techniques described herein will focus on an embodiment in which the bulk silicon fin is neutralized through a solid source doping process. Such a process herein can act to dope either phosphorous or arsenic into the silicon fin which is pre-doped with boron. Treatment can be controlled so that no doping is done directly on the silicon or silicon germanium nanowire or nanosheets through the process integration flow.

Figure 1:
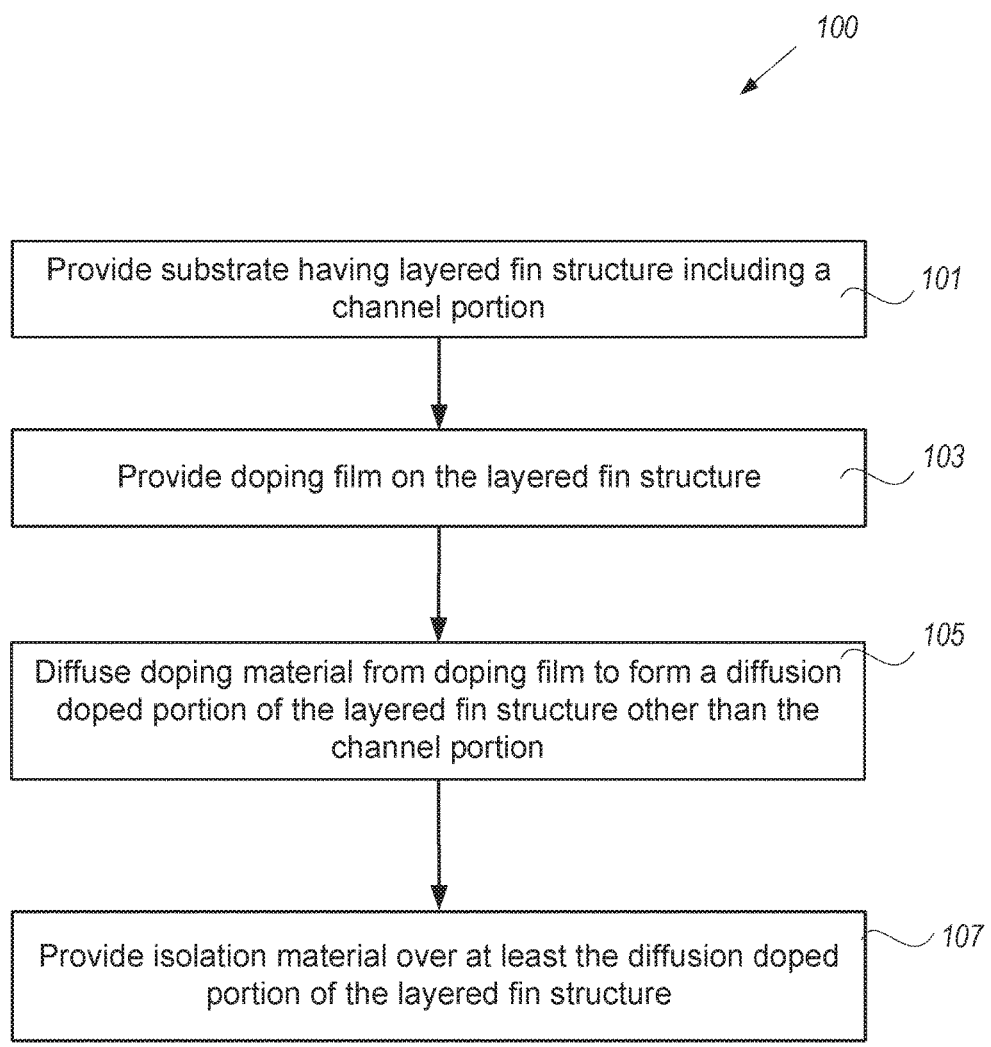
FIG. 1 is a flow chart of a manufacturing process for forming a semiconductor device having bulk fin isolation according to certain aspects of the present disclosure.

Techniques herein include integration and hardware methods to isolate a bulk fin portion 405 from a gate portion of a 3D semiconductor device. FIG. 1 is a flow chart of an example manufacturing process for a forming semiconductor device having an isolated bulk fin portion in accordance with embodiments herein. The process begins with providing a substrate having layered fin structure including a channel portion as seen in step 101. In step 103, a doping film is provided on the layered fin structure. In step 105, the doping material is diffused from doping film to form a diffusion doped portion of the layered fin structure other than the channel portion. In step 107, isolation material is provided over at least the diffusion doped portion of the layered fin structure.

Figure 2:
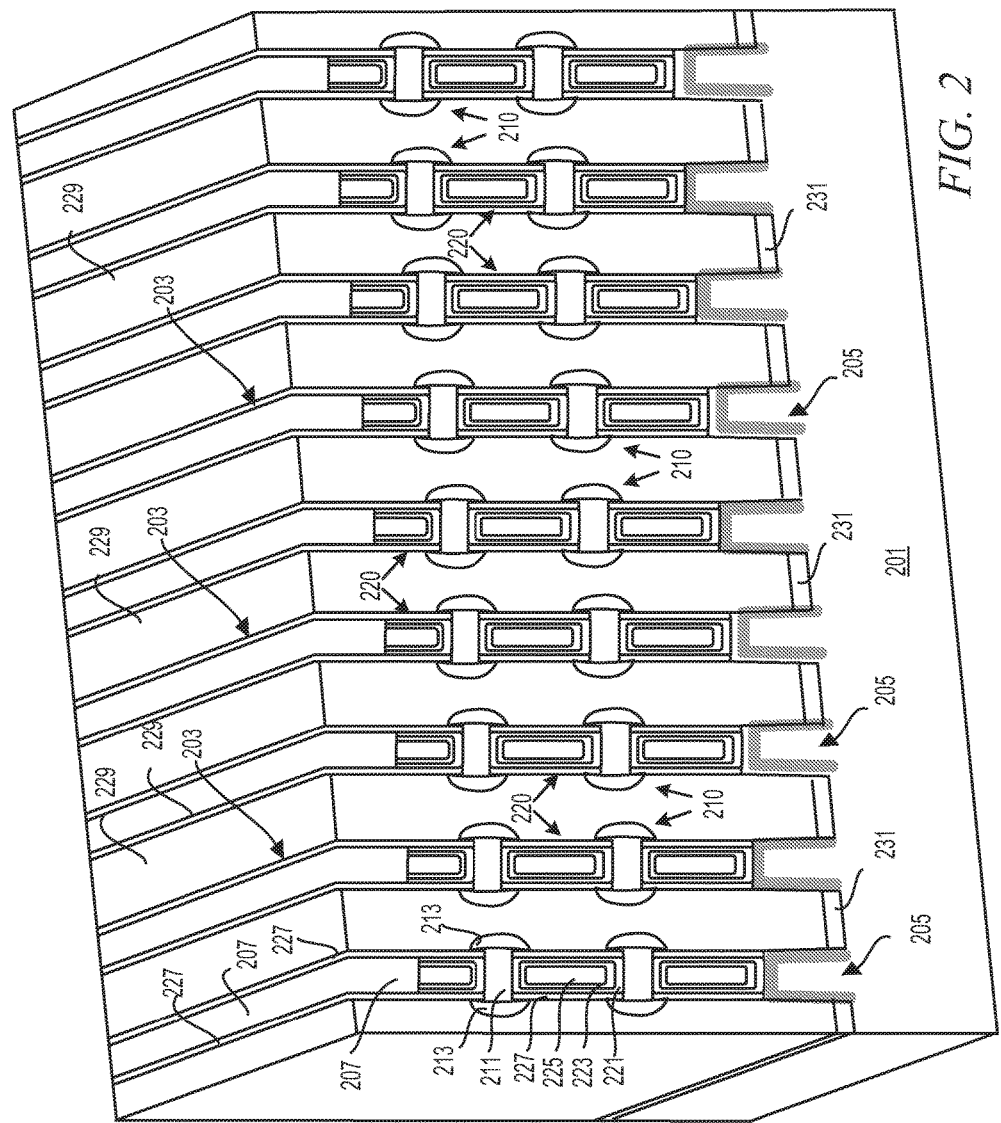
FIG. 2 is a perspective cross-section view of a semiconductor device having bulk fin isolation according to certain aspects of the present disclosure.

FIG. 2 is a perspective cross-section of a multi-channel FET device having an isolated bulk fin portion according to embodiments of the disclosure. FIG. 2 shows a GAA nanowire structure from the orientation along the nanowire itself. Similar to FIG. 4, the device includes a substrate 201 having an array of stacked nanowire structures 203 provided thereon. Each stacked structure 203 includes a bulk fin portion 205 having nanowire devices 210 and gate structures 220 provided thereon. Fins 203 include a diffusion doped fin region 209 to isolate the bulk fin 205 from the gate metal. Each nanowire device 210 includes a nanowire channel region 211 having source/drain regions 213 on opposing sides thereof, and each gate structure 220 includes a high-k layer 221, a work function metal layer 223 and a gate metal fill 225. Cap 207 is provided over each fin 203, and gate spacers 227 electrically insulate the gate structures 220 from source/drain metal 229 provided between adjacent stacked nanowire structures 203. Shallow trench isolation structure 231 is provided between fin structures 203.

FIGS. 3A-3M illustrate structures at various stages in an example process for manufacturing a specific device having a structure of FIG. 2. FIG. 1 will be described in more detail with reference to FIGS. 3A-3M. As known in the art, nanowire or nanosheets can be formed from a "fin" structure of alternating semiconductor materials, such as Si and SiGe. Silicon nanowire formation can be accomplished through isotropic etching of the SiGe in the fin, and formation of a gate spacer material which terminates at the end of the silicon wires on either end of the gate structure. Similarly, SiGe nanowires can be formed by selectively etching Si in the fin relative to SiGe. Techniques herein are applicable to both Si and SiGe nanowires or nanosheets or nanoslabs, as well as to other similar semiconductor structures. For convenience in explaining embodiments herein, the description in FIGS. 1 and 3A-3M is directed to a process where silicon nanowires are produced. Thus, FIGS. 1 and 3A-3M disclose an integration and hardware method to isolate bulk fin from a gate structure of a semiconductor device.

Figure 3A:
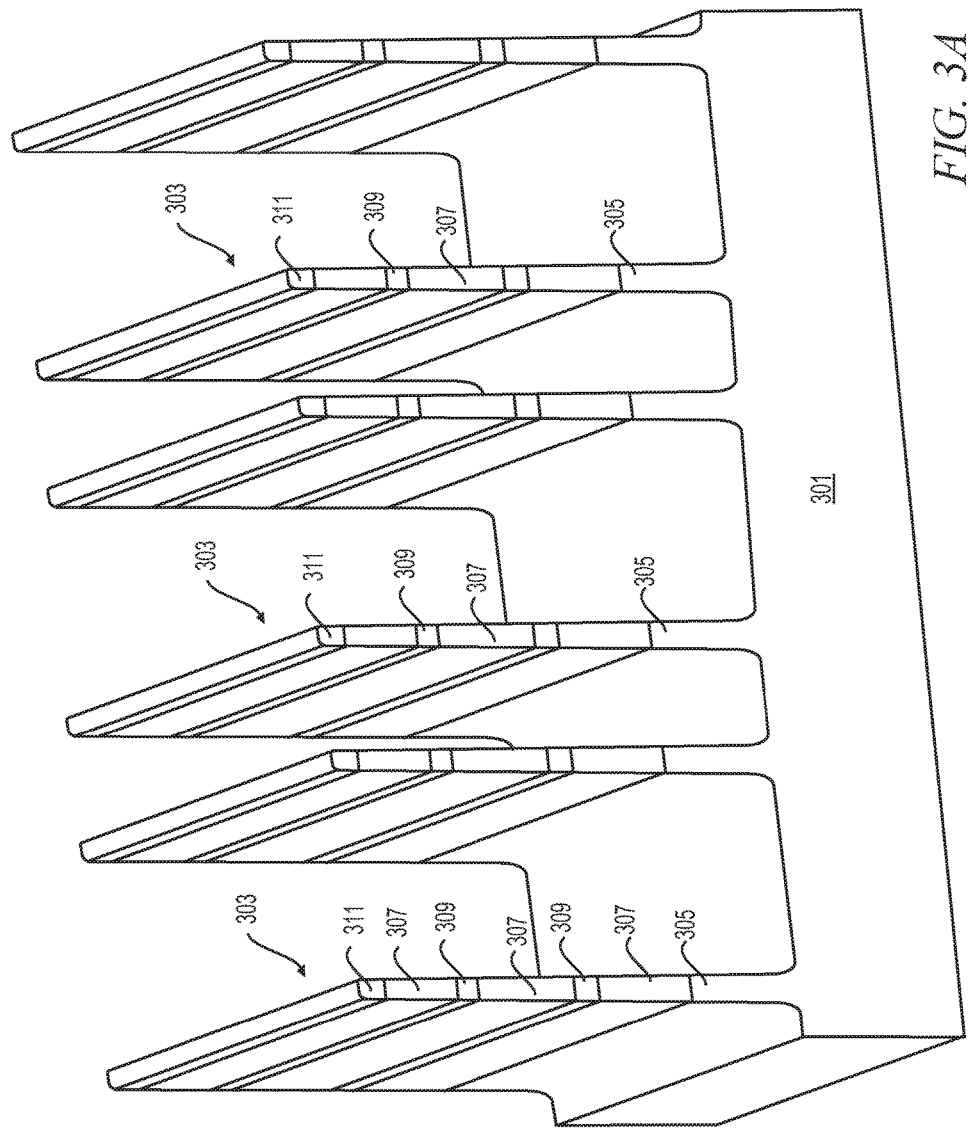
FIG. 3A is a perspective cross-section view of an example starting structure for manufacturing the device of FIG. 2 according to certain aspects of the present disclosure.

Returning to FIG. 1, the method 100 may start with a semiconductor structure such as the example structure shown in FIG. 3A. The structure shows an array of multi-layer fins at an intermediate stage in device processing. The structure includes a substrate 301 having an array of fins 303 thereon. Each fin 303 includes a bulk fin 305, SiGe layers 307 serving a sacrificial portion, and Si nanowires 309 serving as the channel portion. The SiGe 307 will be removed to release the nanowires 309 later in the process. In the structure 300A, the fin structure including nanowires 309 is protected by a cap layer 311.

Optionally, a screen layer 313, such as SiO, can be deposited by atomic layer deposition to form a spacer over the fin 303. The incorporation of this film is optional and is used to control the diffusion of either phosphorous or arsenic into the fin during the drive anneal step discussed below. An example screen layer 313 is illustrated in FIG. 3B.

Figure 3C:
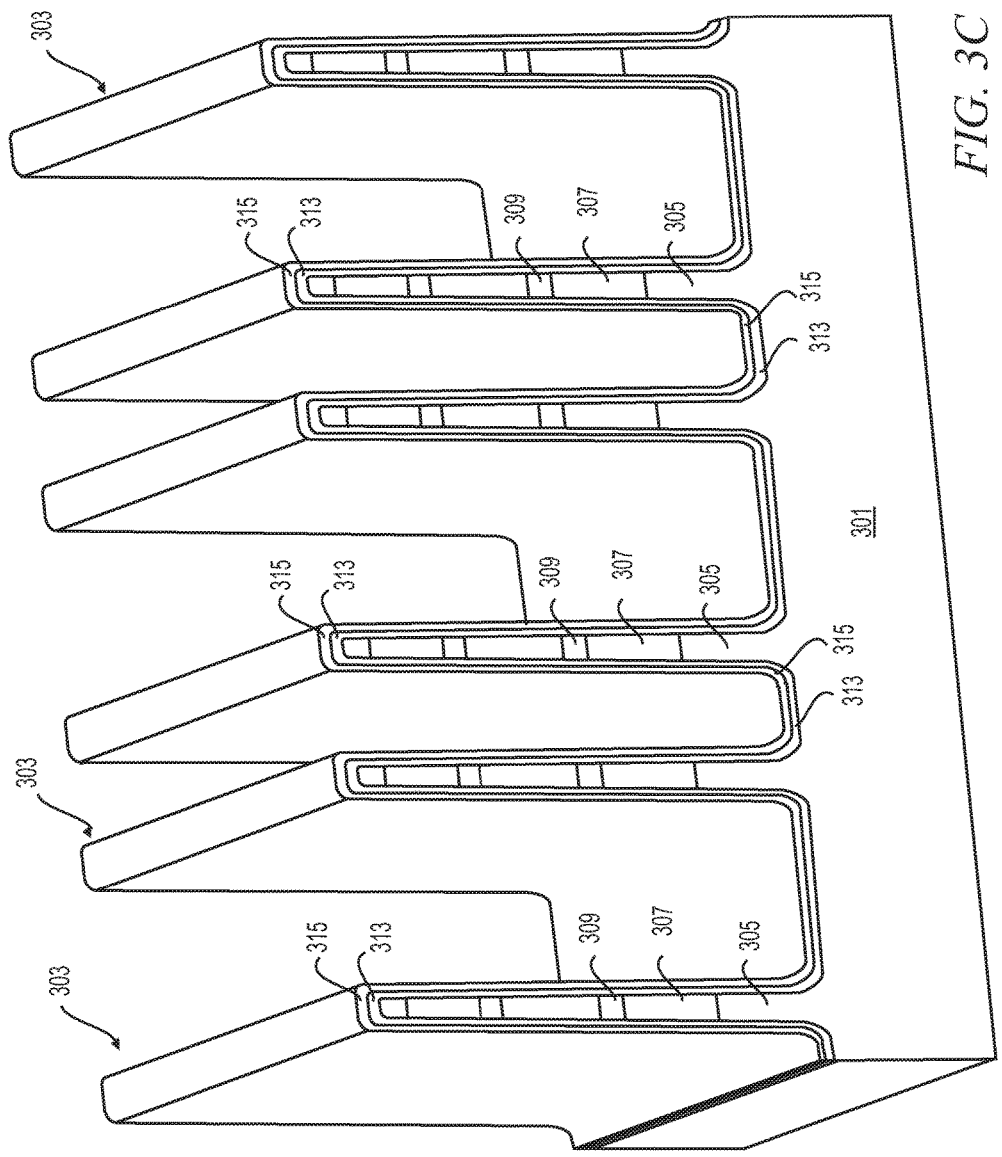
FIG. 3C is a perspective cross-section view of an example intermediate structure in a process of manufacturing the device of FIG. 2 according to certain aspects of the present disclosure.

In step 103 of FIG. 1, a doping film is provided on the layered fin structure. The doping source film is used to diffuse doping material into portions of the layered fin structure. In some embodiments, the doping source film is provided over a portion of the layered fin structure to diffuse dopants into corresponding portions of the layered fin structure. However, a barrier liner may also be used to control diffusion from a doping source layer into selected portions of the fin. In the embodiment of FIG. 3, doping source film 315 is initially provided over the screen layer 313 across the entire fin structure 303 as seen in FIG. 3C. Doping source film 315 can be deposited by either CVD or ALD onto the fin structure. For practical purposes, if the bulk silicon used is p-type in which the silicon is already boron-doped, then the doping source material can be composed of n-type material such as either phosphorous or arsenic such as PSG or AsSG.

Figure 3D:
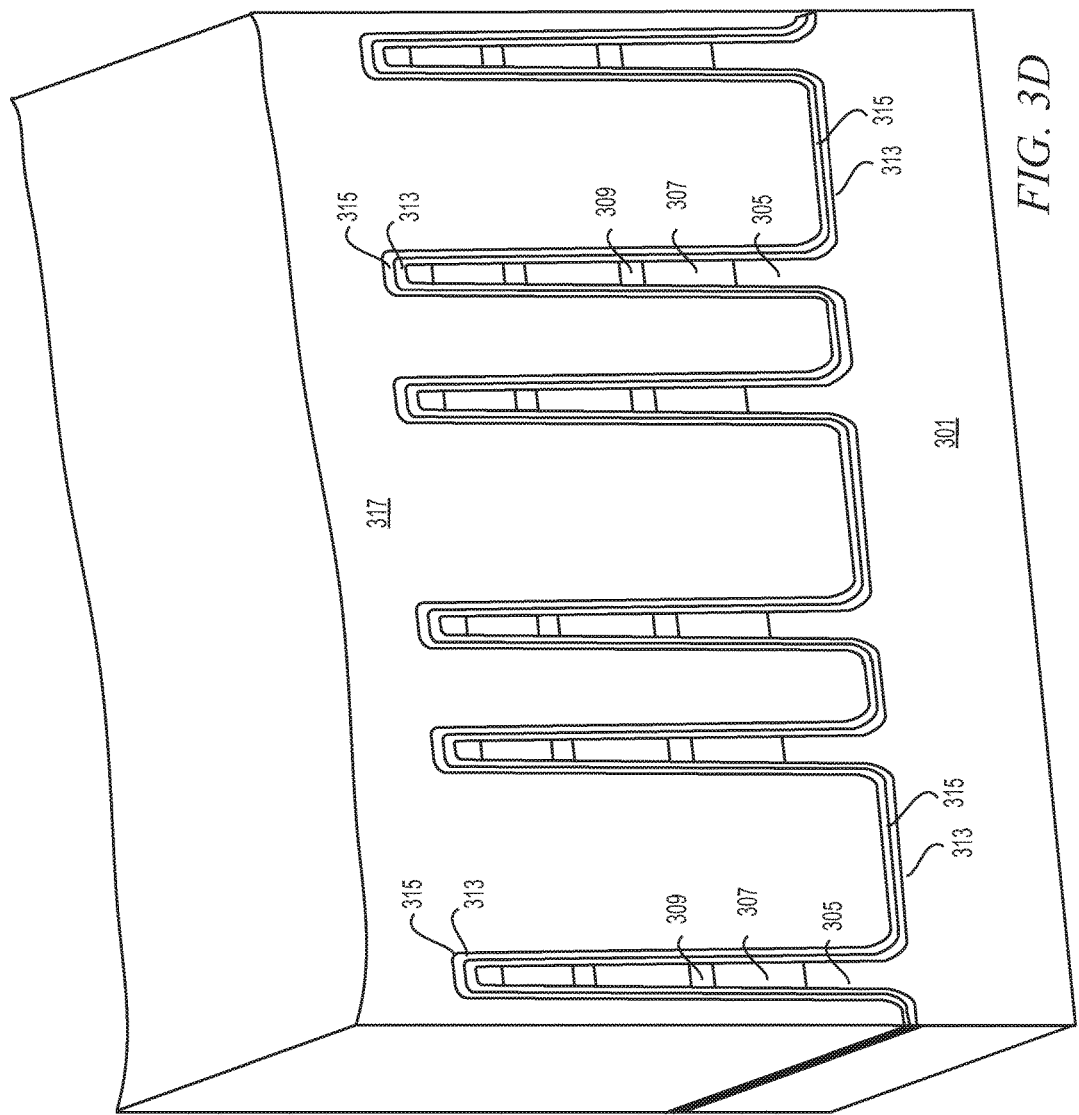
FIG. 3D is a perspective cross-section view of an example intermediate structure in a process of manufacturing the device of FIG. 2 according to certain aspects of the present disclosure.
Figure 3E:
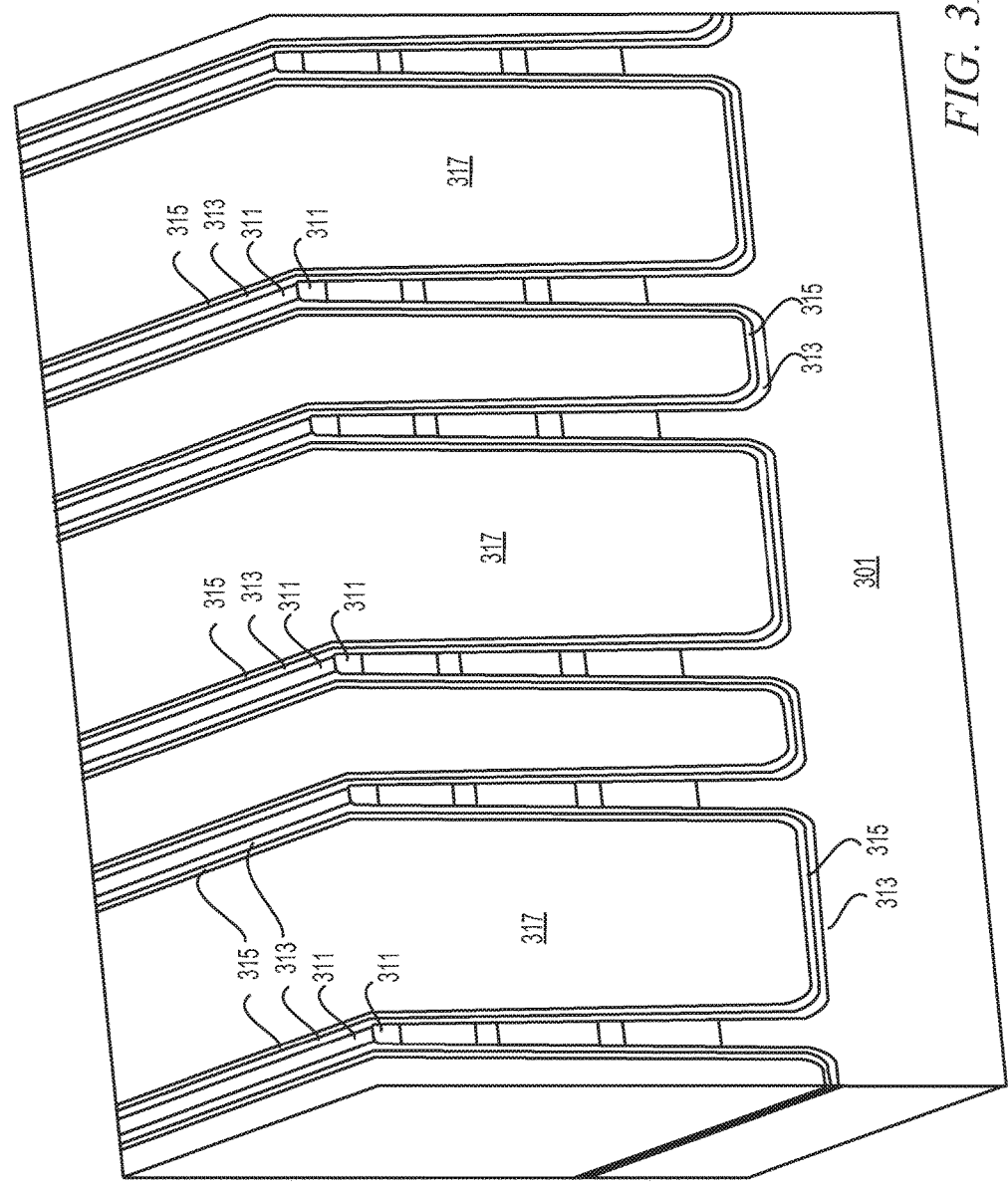
FIG. 3E is a perspective cross-section view of an example intermediate structure in a process of manufacturing the device of FIG. 2 according to certain aspects of the present disclosure.

Removal of a portion of the doping source layer 315 begins with depositing a filler material on the substrate (multi-layer fin array) such as a flowable SiO film or a spin-on organic film. This filler material deposition can result in an overburden of material. FIG. 3D is an example diagram that depicts the result of using a flowable SiO filling material 317 into the fin array. The overburdened filler material 317 is then polished with a stop on the nitride cap 311 that is provided on-top of the fins 303 as a top surface material as seen in FIG. 3E.

Figure 3F:
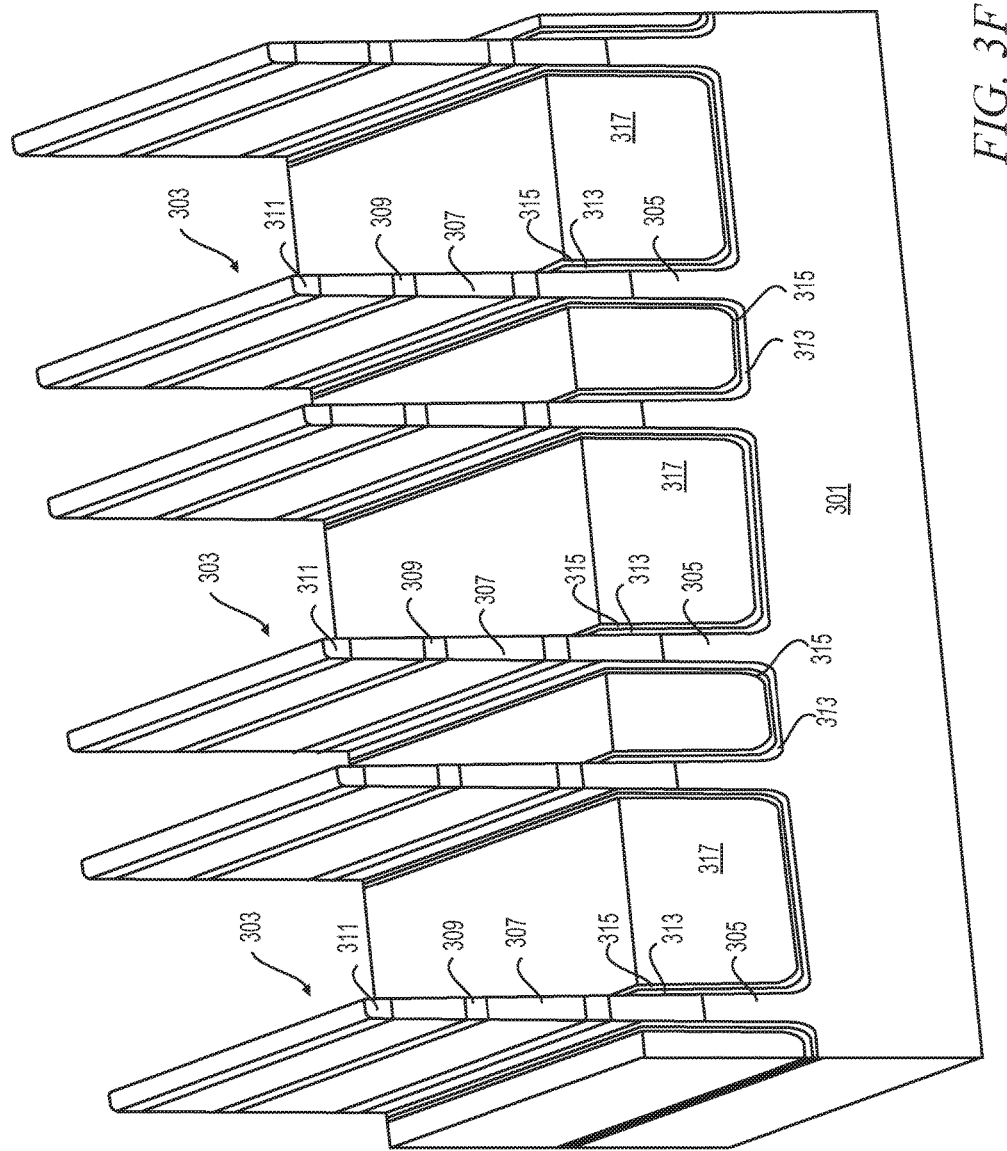
FIG. 3F is a perspective cross-section view of an example intermediate structure in a process of manufacturing the device of FIG. 2 according to certain aspects of the present disclosure.

Once the filler material 317 is planarized with respect to the top of the fin array, any subsequent recess of the filler material is more controllable. For example, the SiO fill 317 can be recessed along with a solid source doping film 315 and screen layer 313 to a level between that of the lower nanowire 309 (or nanoslab) and the remaining bulk silicon fin 305 as seen in FIG. 3F. Such recessing endpoint can be used for fabrication flows including forming devices where silicon wires 307 will be used across both NMOS and PMOS gates or for a common gate for 3D logic application. The positioning of the recess can be switched out for application where SiGe wires are incorporated.

Recessing of the doping film 315 and fill 317 may be performed in a variety of ways. Preferably the SiO fill is recessed isotropically with 1:1 selectivity to the doping film 317 such that these layers are removed in a single process step. Alternatively, the SiO fill 317 is recessed isotropically, leaving the doping film 315 across the entire fin 303, and then a subsequent isotropic etch or even atomic-layer etch (ALE) process can be used to clear the exposed doping source film 315 from the fin where the SiO fill material 317 had been recessed. A subsequent clean step can be executed to ensure that all doping materials are cleared from the silicon wires in the fin.

A position of the recessed SiO fill 317 and doping film 315 may be set to ensure that doping materials do not diffuse through the SiGe layer 307 into Si nanowire 309. Recessing the doping film sufficiently is beneficial because any doping diffusion through the SiGe must be far away to avoid doping the bottom-most silicon wire or slab. In FIG. 3F, the recess is shown to be only down to a level between the bulk silicon fin 305 and the lower-most silicon wire 309, but in other embodiments this amount of recess can optionally extend down to beneath a top-most surface of the bulk silicon fin 307. A given recess depth can be dependent on the doping species used and the diffusion of the doping species within silicon and silicon germanium, respectively.

Figure 3G:
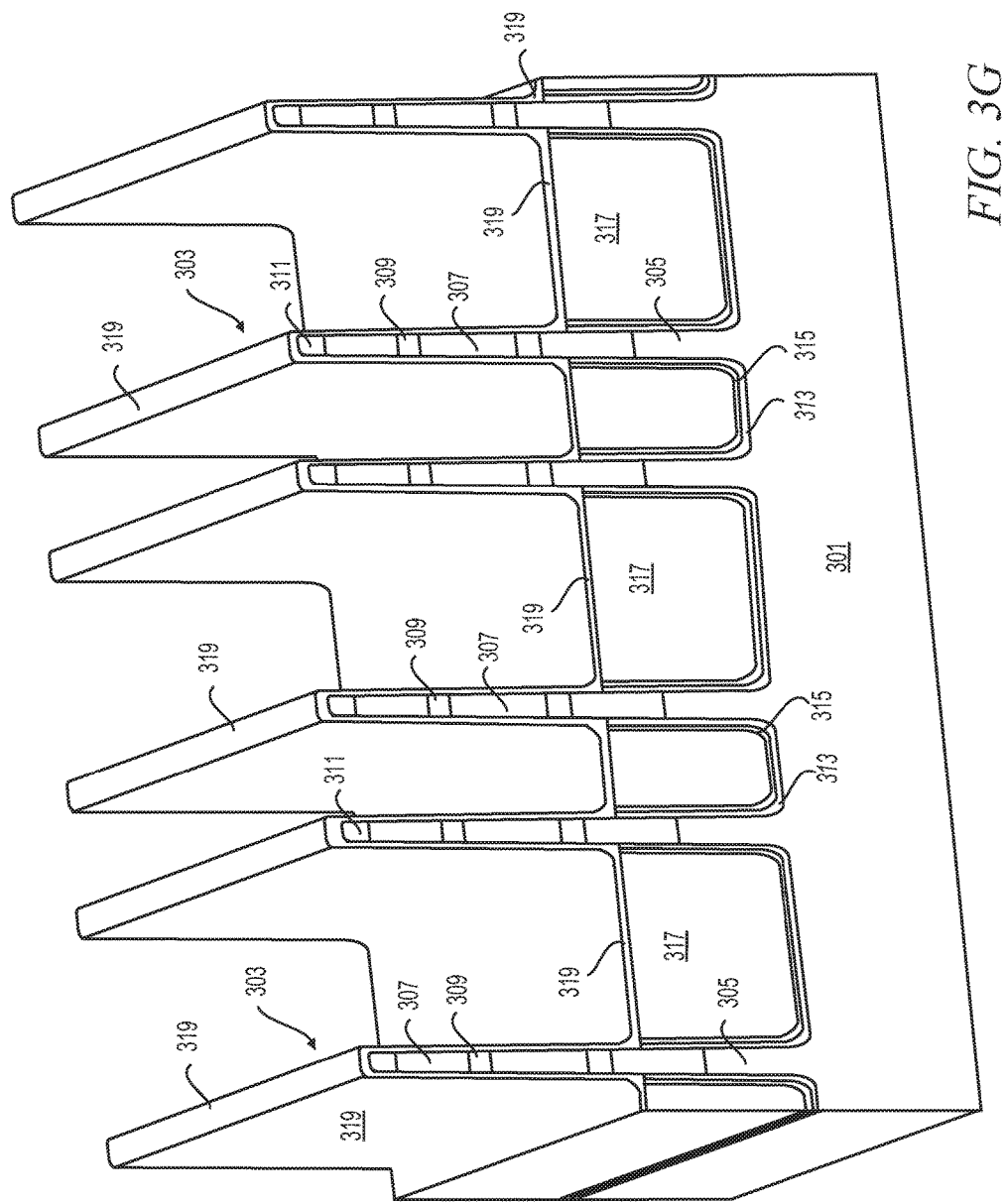
FIG. 3G is a perspective cross-section view of an example intermediate structure in a process of manufacturing the device of FIG. 2 according to certain aspects of the present disclosure.

In one embodiment, an optional liner material such as SiN or BN can be deposited by atomic layer deposition prior to diffusion as seen in FIG. 3G. This liner film 319 can function to prevent any out-diffusion of the phosphorous or arsenic doping species during the drive anneal process.

Returning to FIG. 1, in step 105 doping materials are diffused from the doping film to form a diffusion doped portion of the layered fin structure outside of the channel portion. That is, in the stacked nanowire structure of FIGS. 3A-3M, dopants are diffused into fins 303, including at least nanowires 309.

Diffusion of the doping material may be provided by a dedicated drive anneal process, or with further diffusion provided by a subsequent s/d spike anneal. In the example of FIGS. 3A-3M, a drive anneal step is executed to diffuse the doping species (such as phosphorous or arsenic) into the bulk silicon fin 305 but not into the silicon nanowire or nanosheets 309. Diffusion into the SiGe 307 between the lower-most silicon nanowire 309 and the top of the bulk silicon fin 305 may be acceptable under some circumstances. For example, further diffusion may be minimal during the source/drain spike anneal and thus not sufficient to diffuse into the silicon nanowire 309. Any doped material in the SiGe 307 would come out during the silicon nanowire release step. Also, the drive anneal process can be tuned (time and/or temperature) so that the total diffusion length of the phosphorous or arsenic dopants are set by the combination of the drive and spike anneals.

Figure 3H:
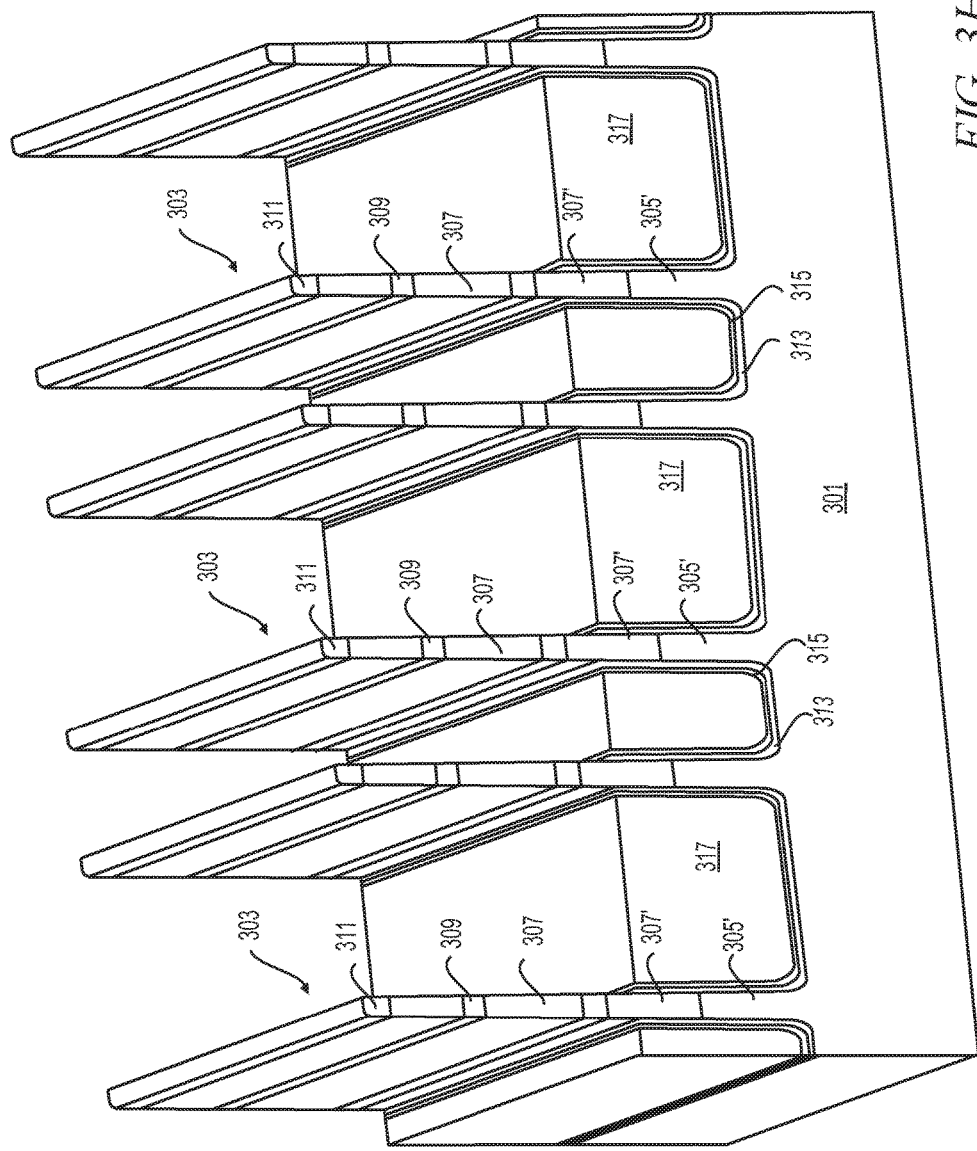
FIG. 3H is a perspective cross-section view of an example intermediate structure in a process of manufacturing the device of FIG. 2 according to certain aspects of the present disclosure.

For embodiments that use a temporary liner material such as SiN or BN during the drive anneal process, the liner is subsequently removed. When using BN, the film properties are such that the material can flash off during the drive anneal step so that temporary liner removal is inherent in the diffusion process. An example result of the drive anneal and removal of the temporary liner 319 is shown in FIG. 3H, where the bulk fin is designated as 305' and the SiGe layer is designated as 307' to indicate a diffusion doped portion in these areas of the fin 303.

Figure 3I:
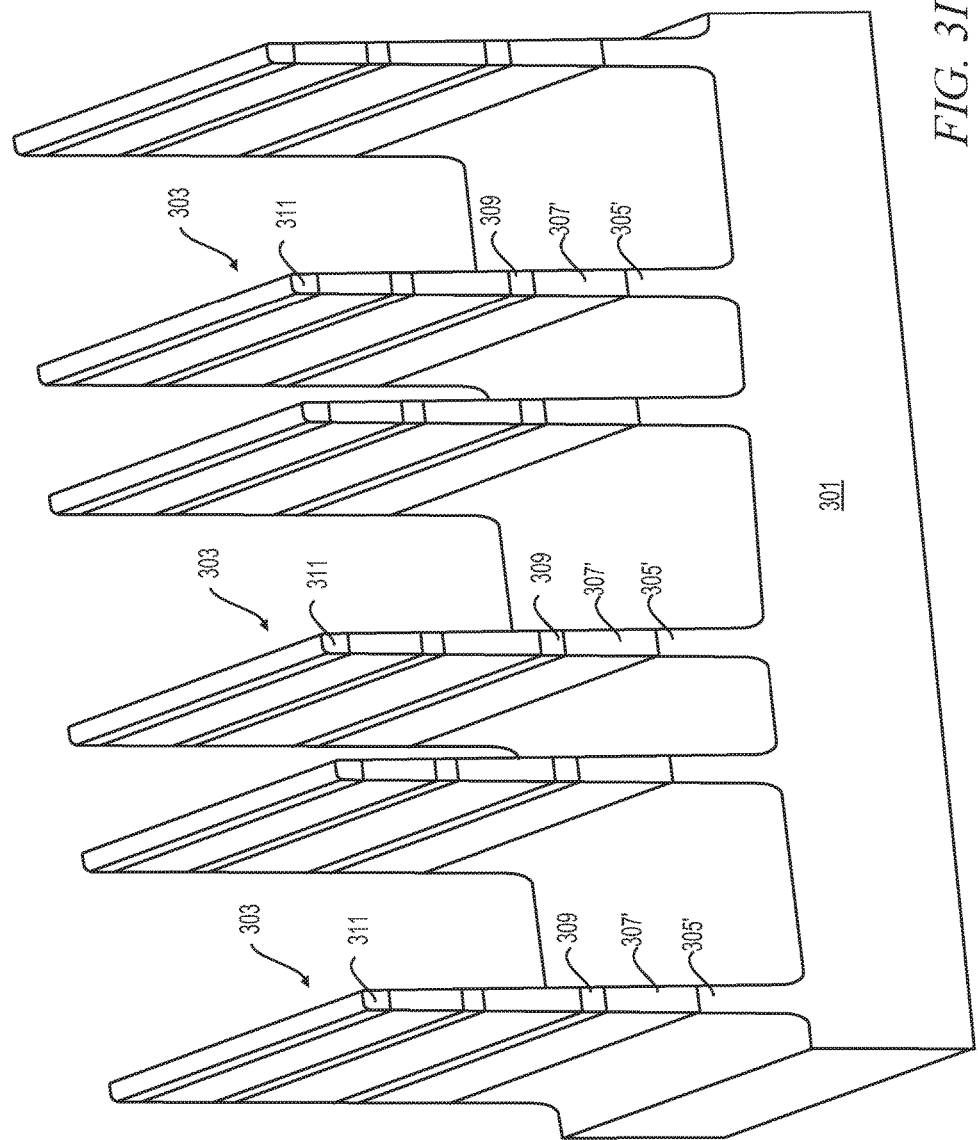
FIG. 3I is a perspective cross-section view of an example intermediate structure in a process of manufacturing the device of FIG. 2 according to certain aspects of the present disclosure.

In one embodiment, the SiO fill material 317 and the solid source doping film 315 are removed from the fin array after diffusion. By this point the dopants have already been driven into the bulk silicon fin 305'. Any residual doping film on the bulk fin 305 silicon surface provides an additional dopant source on the wafer during any subsequent thermal process, unless another liner is deposited overtop the dopant film 315. Thus, the doping film 315 may be left in place on the fin to provide a further dopant source during a source/drain pike anneal, for example. In the embodiment of FIG. 3, the dopant film is removed and then subsequently cleaned from the fin surface. For the case where only the drive anneal is needed to drive the dopant into the bulk silicon fin 305', the dopant source film 315 can be removed. For the case where the diffusion into the bulk fin 305' is set by both the drive anneal and the source/drain spike anneal process, the doping film can remain overtop the bulk silicon fin 305'. If any recess is being executed when the doping source is removed, the process can also remove the screen oxide 313 if desired. An example result is shown in FIG. 3I.

Figure 3J:
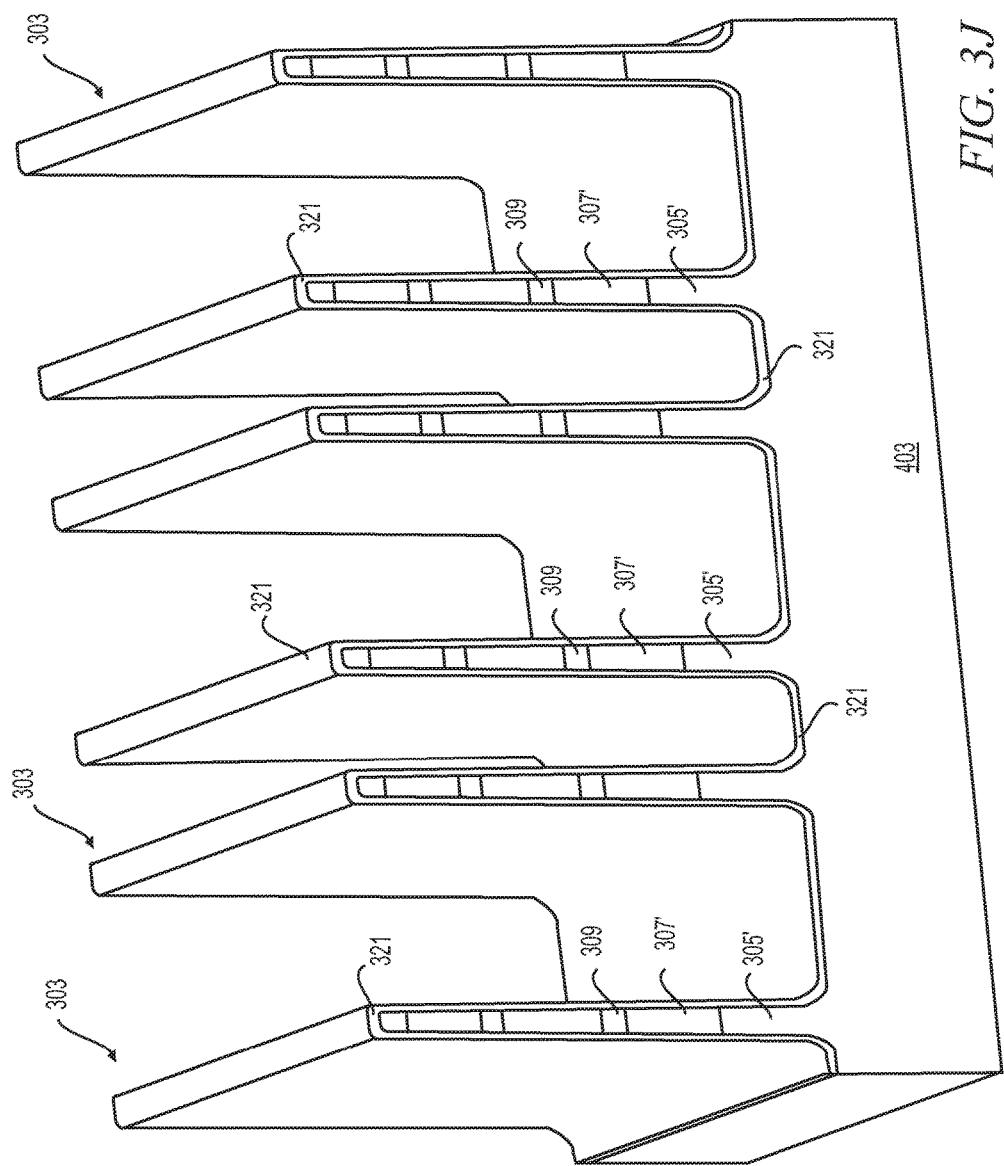
FIG. 3J is a perspective cross-section view of an example intermediate structure in a process of manufacturing the device of FIG. 2 according to certain aspects of the present disclosure.

After diffusion of the doping material into the fins, an isolation material is provided to cover at least the diffusion doped portion of the layered fin structure as seen by step 107 in FIG. 1. In this step, a liner can be deposited overtop the bulk silicon fin 305' in order to prevent any diffusion of the phosphorous or arsenic from the bulk fin 305' into the STI oxide during the source/drain spike anneal after the STI oxide is deposited into the fin array, as seen in FIG. 3J. The SiN liner 321 can be deposited by atomic layer deposition or CVD to cover the fins 303, but will subsequently be recessed below the height of the silicon wires 309 during an STI recess etch process.

Figure 3K:
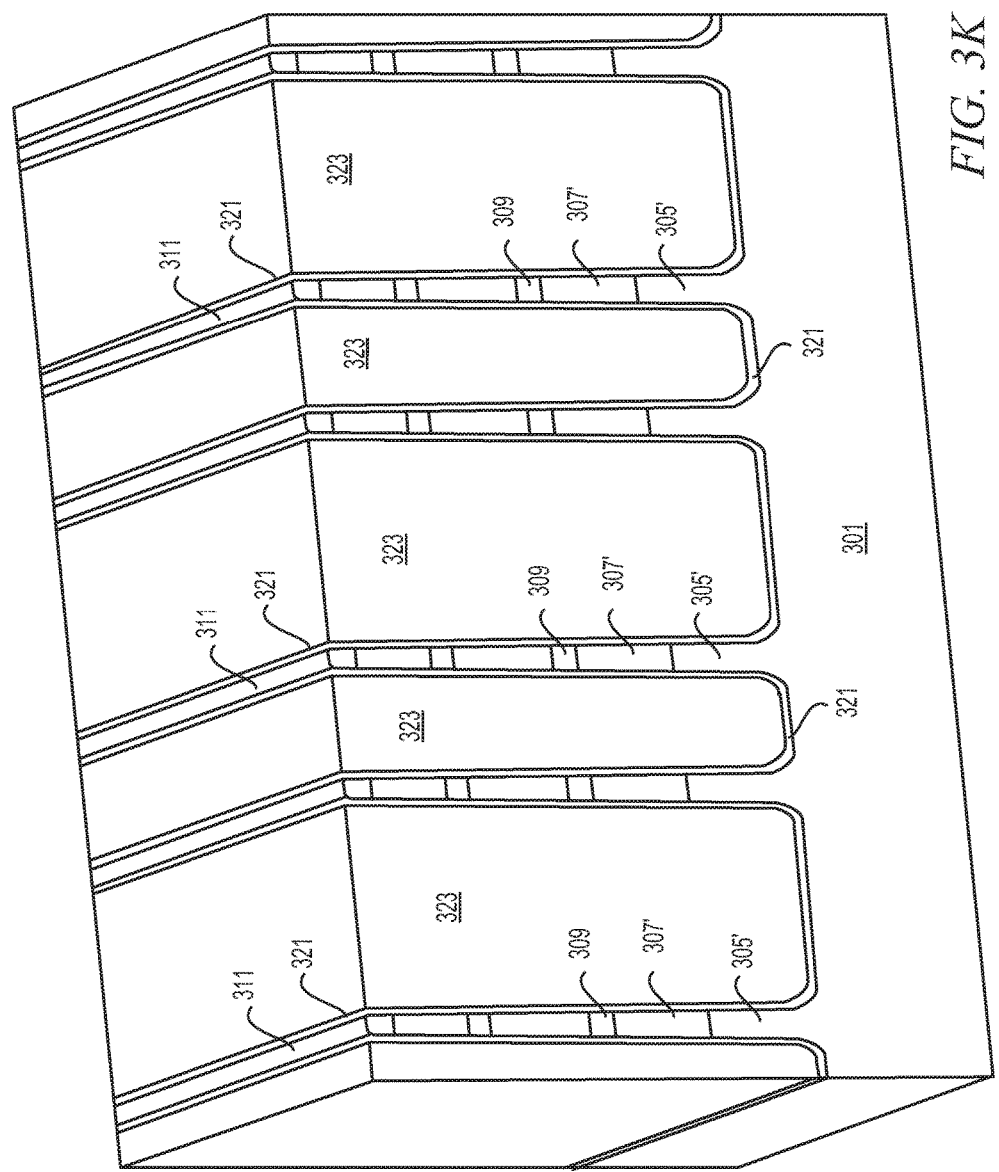
FIG. 3K is a perspective cross-section view of an example intermediate structure in a process of manufacturing the device of FIG. 2 according to certain aspects of the present disclosure.
Figure 3L:
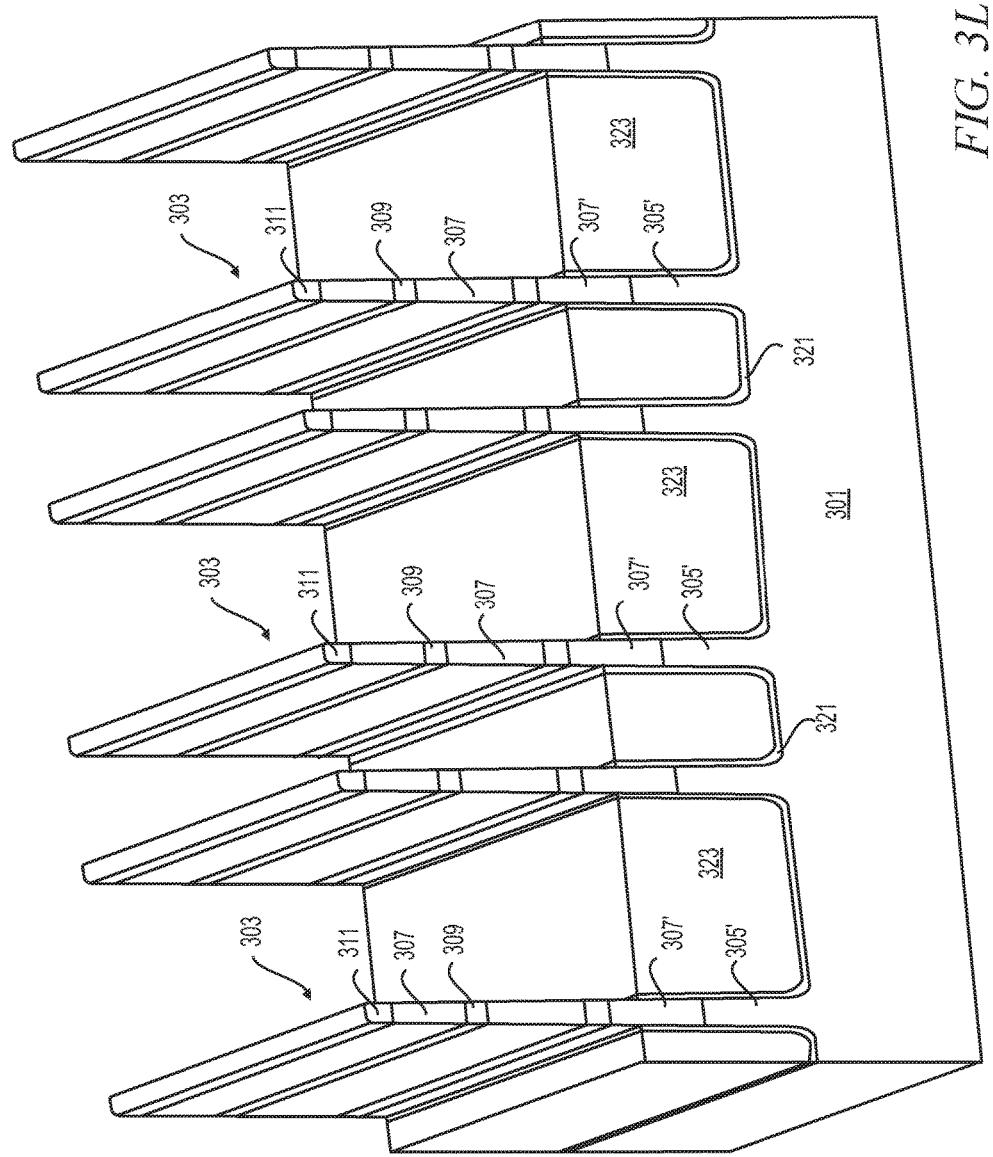
FIG. 3L is a perspective cross-section view of an example intermediate structure in a process of manufacturing the device of FIG. 2 according to certain aspects of the present disclosure.

In forming the STI isolation, STI oxide 323 is deposited over the film 321 and a diffusion doped portion within the fin array (on the substrate). The STI oxide 323 is then polished (removed) down to the SiN cap 311 on top of the fins 303 as shown in FIG. 3K. After polishing, the STI oxide 323 is then recessed down to a desired height. Preferably, the STI oxide 323 will cover at least the diffusion doped portion of the fin 303 caused by the diffusion step 105. In some embodiments, the bottom of the STI oxide 323 will still have the SiN diffusion liner 321 separating each of the doped, bulk silicon 301 and doped residual FIN 305 from the STI oxide 323. Further, in some embodiment, the SiN liner 321 is ONLY removed from the portion of the SiGe and Si that will be used in the actual nanowires. Thus, the SiN liner 321 is also removed from the surface of the Si/SiGe fin 303 above the height of the STI oxide 323. This can be done either through isotropic etch during the STI recess where the selectivity can be tuned to 1:1 selectivity such that the layers are removed in a single process step. Alternatively, a two-step etch process can be used where the STI oxide 323 is recessed down to a desired height, and then the SiN liner 321 exposed on the Si/SiGe fin 303 is etched either through vapor phase etching (chemical oxide removal) or through atomic-layer etch to reveal the Si/SiGe fin above the STI oxide 323. The SiN liner 321 is preserved on the bulk silicon fin 305' and, may be, to some degree, preserved above the bulk silicon fin 305' as see in FIG. 3L. The presence of the liner 321 functions to prevent any diffusion of the phosphorous or boron dopants from the silicon into the STI oxide 321 during subsequent thermal processing such as source/drain spike anneal.

Figure 3M:
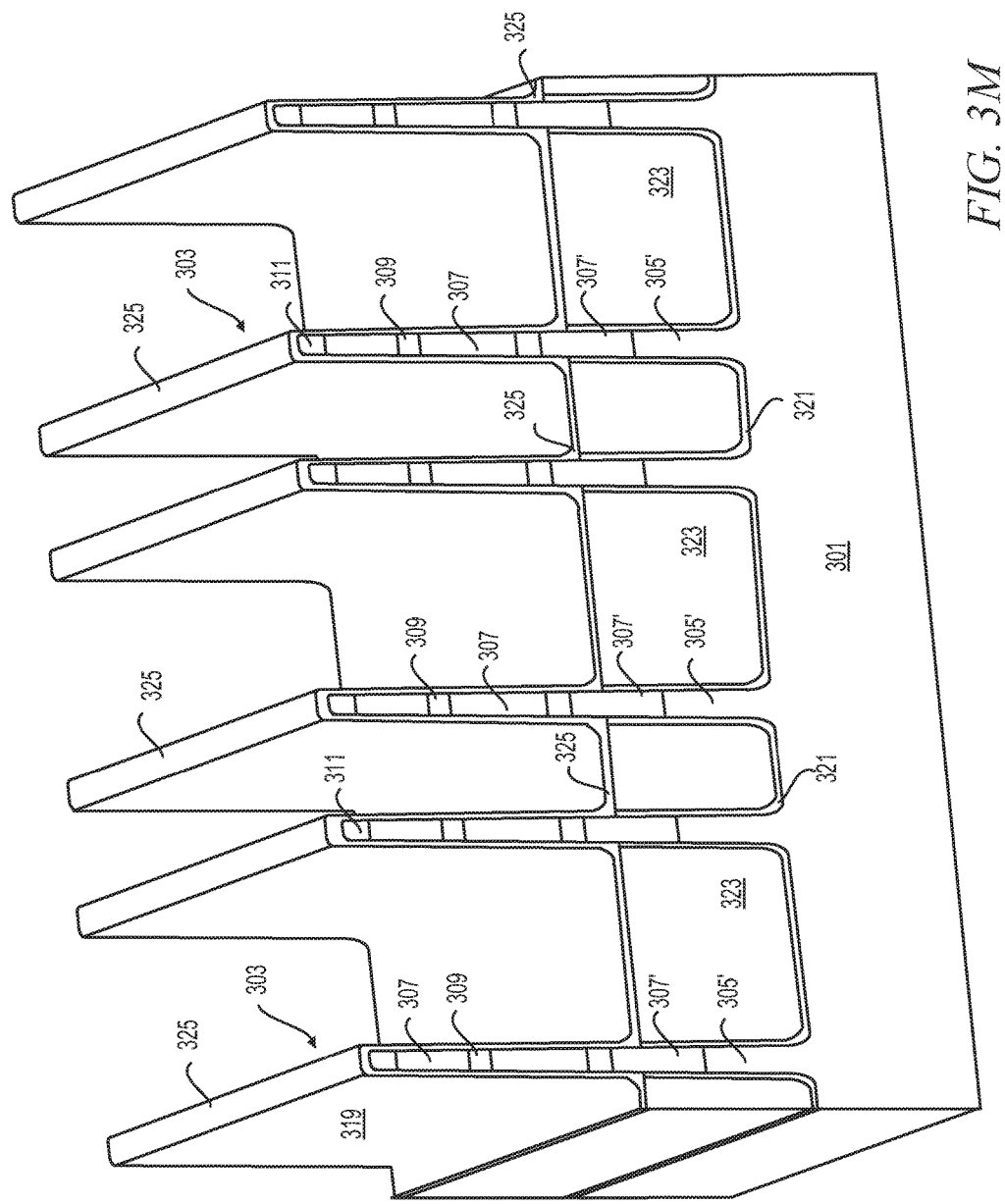
FIG. 3M is a perspective cross-section view of an example intermediate structure in a process of manufacturing the device of FIG. 2 according to certain aspects of the present disclosure.

Following the STI oxide recess, the fins 303 are protected by another liner material which provides some selectivity to the silicon and silicon germanium fin during the replacement gate (polysilicon) clear-out process. As seen in FIG. 3M liner 325 is provided on STI oxide 323 and an upper portion of the fins 303. The liner 325 helps to ensure that the fins 303, and subsequently the nanowires 307 are not damaged during the replacement gate open etch process. Processing of the structure in FIG. 3M continues with releasing nanowires, forming source/drain regions and gate structure such as shown in FIG. 2.

Thus embodiments of the disclosed invention provide a solid source doping process to electrically isolate the bulk fin from a gate structure in a GAA nanowire device. Such solid source diffusion/doping processes have been implemented for FINFET structures where the fin contained within the STI oxide is doped and the fin area to be contacted by the gate is left to remain consistent with the starting silicon (typically p-doped with boron). Such processes for FINFET applications have been transitioned to implant type of applications given the small pitch of fin processes (too many film depositions with inadequate room when considering fin pitches extending down to 22 nm total pitch-or-about 14 nm spacing between 8 nm fins).

With techniques herein the base of the nanowire fin structure is doped to effectively prevent any transfer of charge from one charged gate to an adjacent gate due to a work function metal overtop the bulk fin remaining fin under the metal gate, which cannot easily be removed or buried by dielectric. Accordingly, techniques herein extend solid source doping to dope the silicon fin structure that is contained within the STI oxide and not necessarily the silicon nanowire itself. Thus, techniques herein maintain conventional p-doping levels while neutralizing the bulk silicon. In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed:

1. A method of fabricating a semiconductor device, comprising:
providing a substrate having a layered fin structure thereon, the layered fin structure comprising a base fin portion, a sacrificial portion provided on the base fin portion and a channel portion provided on the sacrificial portion;
providing a doping source film on the substrate over the layered fin structure;
diffusing doping materials from the doping source film into a portion of the layered fin structure separate from the channel portion, to form a diffusion doped region in the layered fin structure; and
providing an isolation material on the substrate over at least the diffusion doped region of the layered fin structure.

2. The method of claim 1, wherein said diffusing comprises:
performing a drive anneal heating to diffuse said doping materials into the layered fin structure; and
tuning at least one of a time and temperature of said drive anneal to prevent diffusing said doping materials into the channel portion of said layered fin structure.

3. The method of claim 2, wherein said diffusing further comprises performing source/drain spike anneal heating to diffuse said doping materials into the layered fin structure.

4. The method of claim 1, wherein providing an isolation material comprising forming a shallow trench isolation layer on said substrate to cover at least the diffusion doped region of the layered fin structure.

5. The method of claim 1, further comprising providing a screen layer over said layered fin structure, said doping source film being provided on said screen layer.

6. The method of claim 1, further comprising providing a liner over said doping source film before said diffusing.

7. The method of claim 1, further comprising:
recessing the doping source film below the channel portion of the layered film structure before the diffusing the doping materials from the doping source film.

8. A method of fabricating a semiconductor device, comprising:
providing a substrate having a layered fin structure thereon, the layered fin structure comprising a base fin portion, a sacrificial portion provided on the base fin portion and a channel portion provided on the sacrificial portion;
providing a doping source film on the substrate over the layered fin structure;
diffusing doping materials from the doping source film into a portion of the layered fin structure other than the channel portion to form a diffusion doped region in the layered fin structure; and providing an isolation material on the substrate over at least the diffusion doped region of the layered fin structure,
wherein said providing a substrate comprises:
providing said base fin as a bulk fin formed from a bulk of doped Si; and
providing a multilayer fin structure on said bulk fin, wherein said multilayer fin structure comprises providing said sacrificial portion as a plurality of SiGe layers alternating with a plurality of Si layers which form said channel portion.

9. The method of claim 8, wherein each of said plurality of Si layers form a nanowire or nanoslab.

10. The method of claim 8, wherein said providing a doping source film comprises providing said doping source film over only a portion of the layered fin structure, a position of the doping source film being selected to prevent diffusion of the doping material into the channel portion.

11. The method of claim 10, wherein said position of the doping source film is selected to cover at least part of the base fin portion of the layered fin structure.

12. The method of claim 11, wherein said position of the doping source film is selected to cover the base fin portion of the layered fin structure.

13. The method of claim 12, wherein said position of the doping source film is selected to cover a portion of the sacrificial portion of the layered fin structure.

* * * * *